United States Patent

Wristers et al.

[11] Patent Number: 5,977,600
[45] Date of Patent: Nov. 2, 1999

[54] FORMATION OF SHORTAGE PROTECTION REGION

[75] Inventors: Derick Wristers, Austin; Jon Cheek, Round Rock; H. James Fulford, Austin, all of Tex.

[73] Assignee: Advanced Micro Devices, Inc., Sunnyvale, Calif.

[21] Appl. No.: 09/002,695

[22] Filed: Jan. 5, 1998

[51] Int. Cl.$^6$ .................................................. H01L 29/94
[52] U.S. Cl. ..................... 257/408; 257/335; 257/336; 257/337; 257/338; 257/339; 257/344; 257/345; 257/900
[58] Field of Search ........................... 257/355, 336–339, 257/344, 345, 408, 347, 900, 290, 291, 292, 293, 294, 374

[56] References Cited

U.S. PATENT DOCUMENTS

| | | | |
|---|---|---|---|
| 5,241,203 | 8/1993 | Hsu et al. ................................. | 257/408 |
| 5,389,811 | 2/1995 | Poucher et al. .......................... | 257/374 |
| 5,440,165 | 8/1995 | Mitsunaga et al. ...................... | 257/344 |
| 5,512,771 | 4/1996 | Hiroki et al. ............................. | 257/336 |
| 5,565,700 | 10/1996 | Chou et al. ............................. | 257/344 |
| 5,719,425 | 2/1998 | Akram et al. ............................ | 257/336 |

*Primary Examiner*—Fetsum Abraham

[57] ABSTRACT

The formation of a shortage protection region is disclosed. In one embodiment, a method includes three steps. In the first step, a first ion implantation is applied to form lightly doped regions within a semiconductor substrate adjacent to sidewalls of a gate over the substrate. In the second step, two spaces are formed on the substrate, each adjacent to a sidewall of the gate, so that a second ion implantation forms heavily doped regions within the substrate adjacent to the first spacers. In the third step, two additional spacers are formed on the substrate, each overlapping and extending beyond a corresponding spacer previously formed. Thus, a third ion implantation forms lightly doped shortage protection regions within the substrate adjacent to the spacers most recently formed.

13 Claims, 3 Drawing Sheets

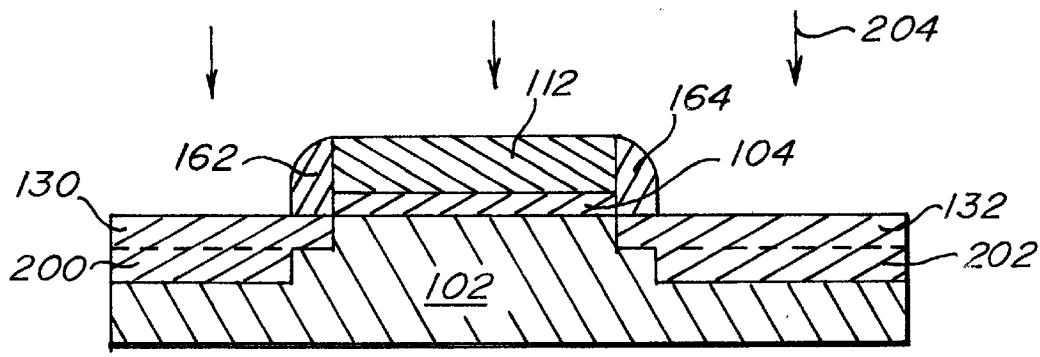
_Fig. 1F._
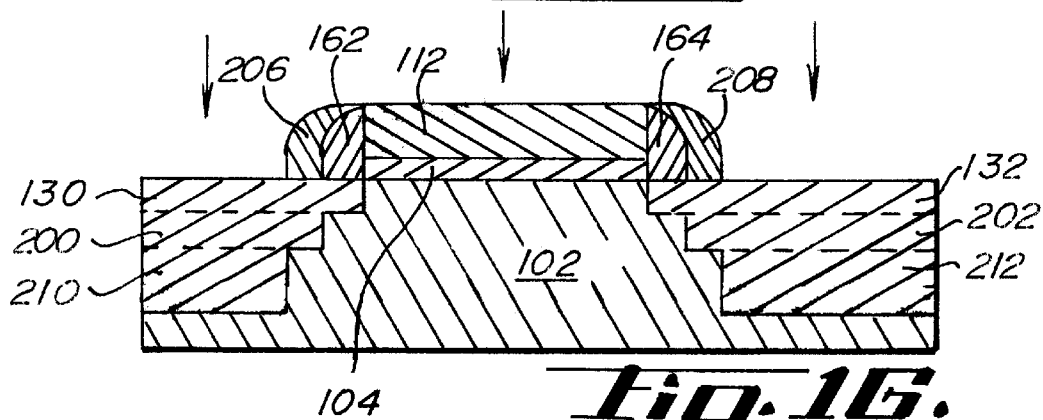
_Fig. 1G._
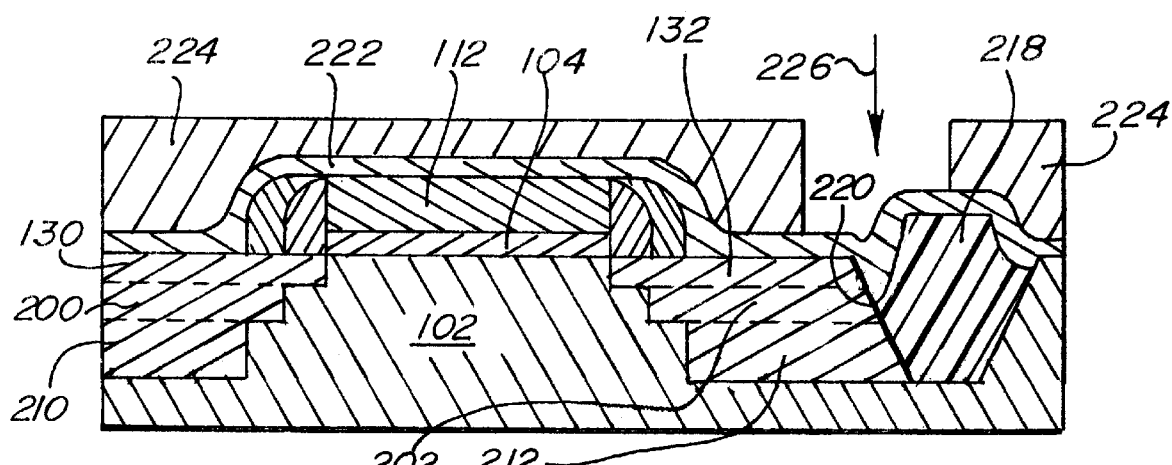
_Fig. 1H._

FORMATION OF SHORTAGE PROTECTION REGION

FIELD OF THE INVENTION

The present invention relates generally to integrated circuit manufacturing and more particularly to the formation of a shortage protection region.

BACKGROUND OF THE INVENTION

An insulated-gated field-effect transistor (IGFET), such as a metal-oxide semiconductor field-effect transistor (MOSFET), uses a gate to control an underlying surface channel joining a source and a drain. The channel, source and drain are located within a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

To electrically isolate IGFETs or other devices fabricated within the same silicon substrate, techniques such as LOCOS and SWAMI are used. LOCOS is the local oxidation of silicon, a surface isolation scheme where silicon dioxide is grown around islands of silicon nitride, which is in turn removed to leave oxide-free areas for the formation of circuit components. SWAMI is an enhanced LOCOS-like technique.

Still another technique is the formation of a trench isolation, and more particularly the formation of a shallow trench isolation, within the substrate. The procedure for forming a trench insolation is the same as forming trench capacitors. Thus, trenches are etched either isotropically with wet techniques or anistropically with dry etch techniques. An insulating material, such as silicon dioxide, may then be deposited within the trench to act as a insulating layer.

A difficulty with trench isolation, however, is that the formation of subsequent metallization layers may result in overetching of the insulating material (e.g., silicon dioxide), such that deposition of a metal shorts an active region with the silicon substrate, which is usually grounded. For example, one metallization technique involves first applying a thin layer of silicon oxynitride prior to the deposition of tetra-ethyl-ortho-silicate (TEOS). The silicon oxynitride acts as an etch stop when the TEOS is selectively etched to expose the components to be, for example, locally interconnected (LI'ed).

Because silicon oxynitride is an insulator, however, it must be removed prior to depositing metal in the area exposed by the selective etching of the TEOS. Etching the silicon oxynitride is usually not selective to silicon oxynitride, however; silicon dioxide may also be etched. Thus, the oxide material within a trench may be etched away during removal of the silicon oxynitride layer, exposing the silicon substrate such that a short between an active region and the substrate may result.

There is a need, therefore, for prevention of such shorting during metallization (e.g., during the formation of local interconnects.

SUMMARY OF THE INVENTION

The above-mentioned shortcomings, disadvantages and problems are addressed by the present invention, which will be understood by reading and studying the following specification. The invention relates to the formation of a shortage protection region. In one embodiment, a method includes three steps. In the first step, a first ion implantation is applied to form lightly doped regions within a semiconductor substrate adjacent to sidewalls of a gate over the substrate. In the second step, two spacers are formed on the substrate, each adjacent to a sidewall of the gate, so that a second ion implantation forms heavily doped regions within the substrate adjacent to the first spacers. In the third step, two additional spacers are formed on the substrate, each overlapping and extending beyond a corresponding spacer previously formed. Thus, a third ion implantation forms lightly doped shortage protection regions within the substrate adjacent to the spacers most recently formed.

The shortage protection regions have a depth extending beyond that of the heavily doped regions (i.e., source and drain regions) that may otherwise normally be created. This depth is such that, if overetching of oxide deposited in an isolation trench occurs during metallization, a short between the heavily doped regions and the substrate will not occur. The shortage protection regions are lightly doped so that they do not cause lateral diffusion, or otherwise affect the characteristics of the fabricated transistor. That is, the shortage protection region is a benign implant.

The present invention describes methods, devices, and computerized systems of varying scope. In addition to the aspects and advantages of the present invention described here, further aspects and advantages of the invention will become apparent by reference to the drawings and by reading the detailed description that follows.

BRIEF DESCRIPTION OF THE DRAWINGS

FIGS. 1A–1J show cross-sectional views of successive process steps for making an IGFET in accordance with one embodiment of the invention; and, FIG. 2 is a diagram of a computerized system, in accordance with which the invention may be implemented.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Figure 1A:
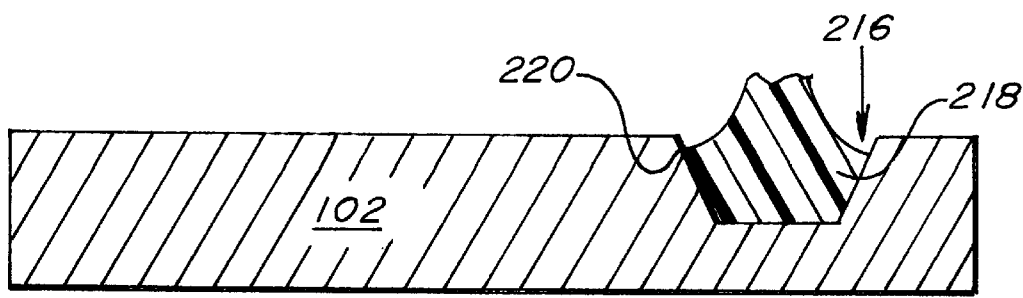

Described first is an IGFET known as a MOS. In FIG. 1A, silicon substrate 102 suitable for integrated circuit manufacture includes P-type epitaxial layer with a boron background concentration on the order of $1 \times 10^{16}$ atoms/cm$^3$, a <100> orientation and a resistivity of 12 ohm-cm. Desirably, the epitaxial surface layer is disposed on a P+ base layer, not shown, and includes a planar top surface.

Also in FIG. 1A, shallow isolation trench 216 is formed, desirably by etching either isotropically with wet techniques or anisotropically with dry etch techniques. Thereafter, oxide 218 is deposited within trench 216. The deposition is such that edge 220 of oxide 218 meets substrate 102 at what will later be lightly doped regions within substrate 102. For purposes of clarity, trench 216 with oxide 218 is not shown in FIGS. 1B–1G, although those of ordinary skill in the art will appreciate that it is in fact present.

Figure 1B:
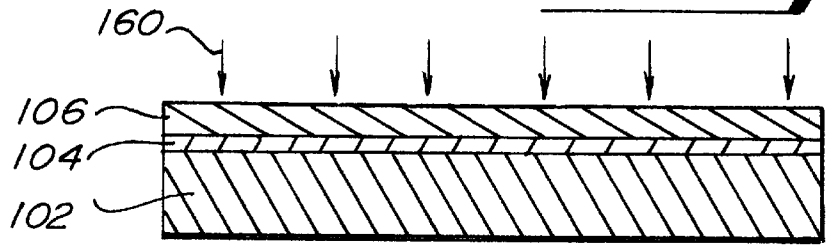

In FIG. 1B, gate oxide 104, comprised of silicon dioxide, is formed on the top surface of substrate 102 using oxide tube growth at a temperature of 700 C to 1000 C, in an $O_2$ containing ambient. A typical oxidation tube contains several sets of electronically powered heating coils surrounding the tube, which is either quartz, silicon carbide, or silicon, desirably. In $O_2$ gas oxidation, the wafers are placed in the tube in a quartz "boat," and the gas flow is directed across the wafer surfaces to the opposite or exhaust end of the tub. Gate oxide 104 has a thickness of 30 angstroms, desirably.

Thereafter, a blanket layer of undoped polysilicon 106 is deposited by low pressure chemical vapor deposition (LPCVD) on the top surface of gate oxide 104. Polysilicon 106 has a thickness of 2000 angstroms, desirably. The polysilicon 106 deposited on the substrate 102 is implanted with nitrogen ions, as depicted by arrows 160. The nitrogen ions are added to retard the diffusion of boron atoms. The polysilicon is implanted at a dosage of $5\times10^{14}$ to $5\times10^{15}$ atoms/cm$^2$, and at an energy level of 20 to 200 keV.

Figure 1C:
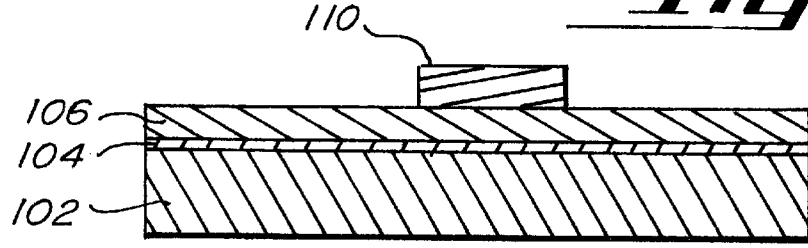

In FIG. 1C, photoresist 110 is deposited as a continuous layer on polysilicon 106 and selectively irradiated using a photolithographic system, such as a step and repeat optical projection system, in which ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1D:
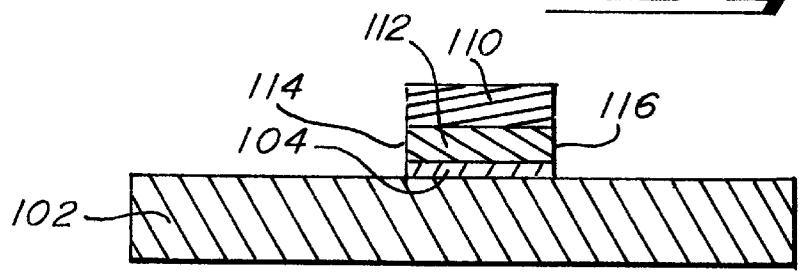

In FIG. 1D, an anisotropic etch is applied that removes the exposed portions of polysilicon 106 and the underlying portions of gate oxide 104. Desirably, a first dry etch is applied that is highly selective of polysilicon, and a second dry etch is applied that is highly selective of silicon dioxide, using photoresist 110 as an etch mask. After etching occurs, the remaining portion of polysilicon 106 provides polysilicon gate 112 with opposing vertical sidewalls (or, edges) 114 and 116. Polysilicon gate 112 has a length (between sidewalls 114 and 116) of 500–2500 angstroms, desirably.

Figure 1E:
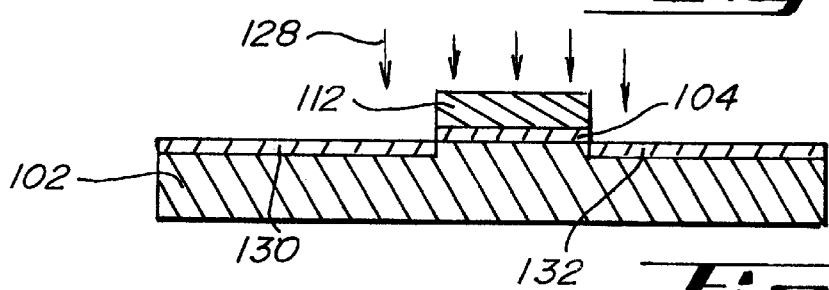

In FIG. 1E, photoresist 110 is stripped, and lightly doped regions 130 and 132 are formed by an ion implantation, as represented by arrows 128. The ion implantation may be an n-type dopant, such as arsenic, if an NMOSFET is desired, or a p-type dopant, such as boron, if a PMOSFET is desired. The lightly doped regions are formed within substrate 102 immediately adjacent to the sidewalls of gate 112.

In FIG. 1F, spacers 162 and 164 are formed. Spacers 162 and 164 may be of a material such as nitride, although the invention is not so limited. Spacers 162 and 164 are formed immediately adjacent to gate 112 over substrate 102. Thereafter, heavily doped regions 200 and 202 (i.e., source and drain regions) are formed by a second ion implantation, as represented by arrows 204. Heavily doped regions 200 and 202 are formed within the substrate 102, extending past lightly doped regions 130 and 132, immediately adjacent to spacers 162 and 164. Spacers 162 and 164 thus act as masks, protecting the portions of lightly doped regions 130 and 132 thereunder from being heavily doped.

In FIG. 1G, second spacers 206 and 208 are formed. Spacers 206 and 208 may also be of a material such as nitride, although again the invention is not so limited. Spacers 206 and 208 are formed on substrate 102, such that overlap but extend past laterally (i.e., width-wise) spacers 162 and 164, respectively. Thereafter, lightly doped shortage protection regions 210 and 212 are formed by a third ion implantation, as represented by arrows 214. Lightly doped regions 210 and 212 are formed within substrate 102, extending to a depth past heavily doped regions 200 and 202, and immediately adjacent to spacers 206 and 208.

The lightly doped shortage protection regions do not alter the characteristics of the IGFET being formed. That is, the dopant is not sufficiently high to cause lateral diffusion. Rather, the dopant is a benign implant. The implantation causes the regions to have a depth sufficient that overetching in subsequent metallization steps does not result in the potential for a short to be created between the active regions (i.e., the heavily doped regions) and the substrate, as will be described.

In FIG. 1H, trench 216 with oxide 218 is again shown, although as has been described, it had been nevertheless present in FIGS. 1B–1G. Silicon oxynitride layer 222 is deposited over the IGFET fabricated as a result of steps FIGS. 1A–1G. Tetra-ethyl-ortho-silicate (TEOS) layer 224 (i.e., a mask) is subsequently deposited thereon and polished. Photoresist, not shown, is deposited on TEOS layer 224, and selectively irradiated so that subsequent etching of TEOS layer 224 results in formation of trench 226. During this etching, silicon oxynitride layer 222 acts as an etch-stop.

Figure 1I:
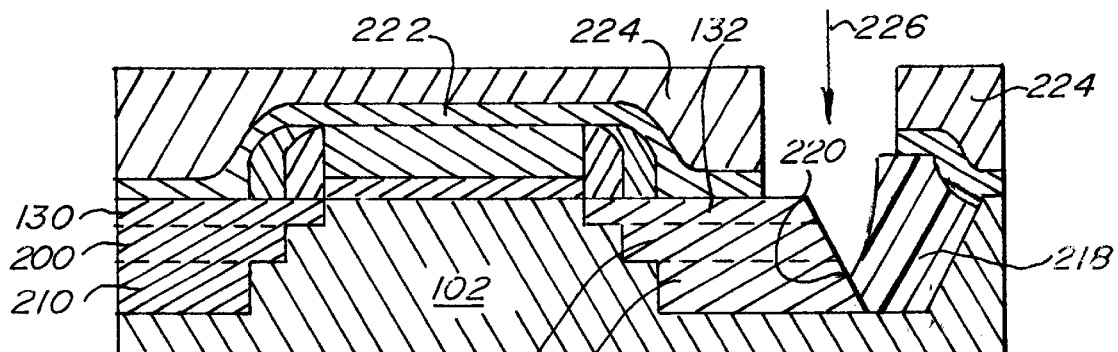

In FIG. 1I, etching is further performed selective to the silicon oxynitride layer 222, to remove this layer from within trench 226. Because this etchant is not overly selective, some of oxide layer 218 may also be etched away. This is shown in FIG. 1I, where edge 220 of layer 218, as a result of etching, has deepened such that it meets substrate 102 at lightly doped shortage protection region 212, and not at heavily doped region 202 as before.

Thus, the invention provides for protection from shortages that may potentially result if shortage protection region 212 were not present. That is, but for protection region 212, edge 220 would meet substrate 102 beyond the heavily doped region. Once a metal (i.e., a local interconnect) was deposited in trench 226, however, substrate 102, which is typically grounded, would be shorted to heavily doped region 202. The prevention of these types of shorts is an advantage of the invention.

Figure 1J:
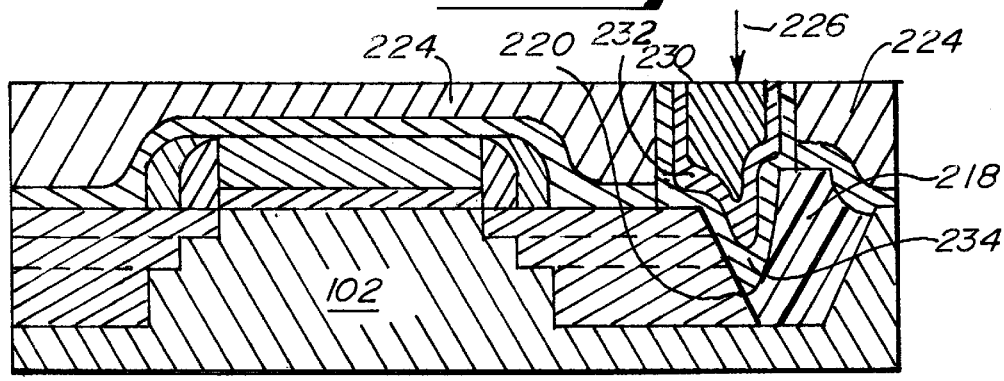

Finally, in FIG. 1J, metal (i.e., a local interconnect) is deposited within trench 226. Thus, a titanium layer 234 is first deposited, a titanium nitride layer 236 is next deposited, and then tungsten 230 is deposited within the trench. The layers 234 and 236 act as glue-like layers to secure the tungsten 230 such that it will not become removed from the trench 226.

Figure 2:
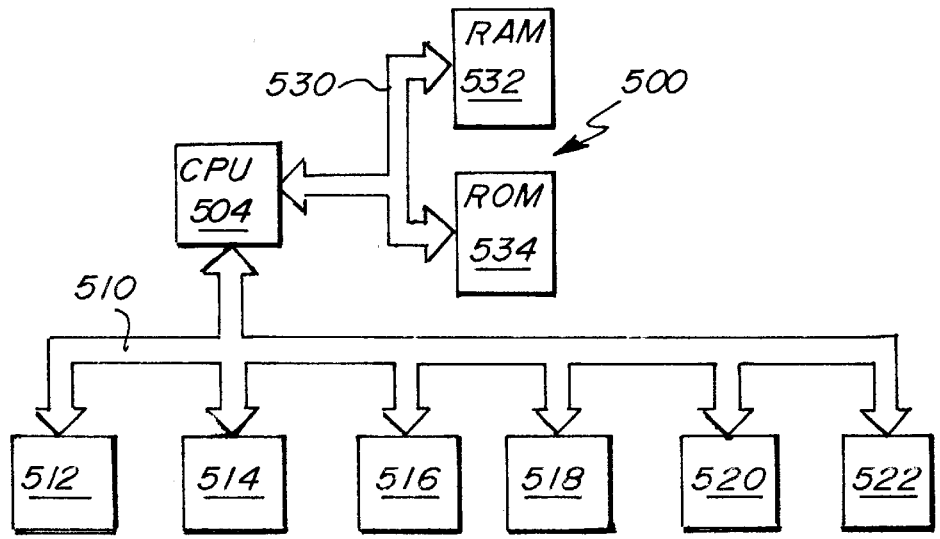

Referring next to FIG. 2, advantageously the invention is well-suited for use in a device such as an integrated circuit chip, as well as an electronic system including a central processing unit, a memory and a system bus. The electronic system may be a computerized system 500 as shown in FIG. 3. The system 500 includes a central processing unit 500, a random access memory 532, and a system bus 530 for communicatively coupling the central processing unit 504 and the random access memory 532. The system 500 includes a device formed by the steps shown in and described in conjunction with FIGS. 1A–1G. The system 500 may also include an input/output bus 510 and several peripheral devices, such as devices 512, 514, 516, 518, 520 and 522, which may be attached to the input/output bus 510.

Peripheral devices may include hard disk drives, floppy disk drives, monitors, keyboards, and other such peripherals.

Formation of shortage protection regions has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof.

We claim:

1. A device comprising:
   a gate over a substrate having two sidewalls, two first spacers immediately adjacent to the sidewalls, and two second spacers overlapping and extending beyond the first spacers;
   first lightly doped regions within the substrate adjacent to and generally aligned with the sidewalls of the gate;
   heavily doped regions within the substrate below the first lightly doped regions and adjacent to and generally aligned with the first spacers; and,
   second lightly doped shortage protection regions within the substrate below the heavily doped regions and adjacent to and generally aligned with the second spacers.

2. The device of claim 1, further comprising a shallow trench isolation within the substrate.

3. The device of claim 2, further comprising an oxide layer within the shallow trench isolation.

4. The device of claim 2, further comprising a metallization layer over the gate.

5. The device of claim 4, wherein the metallization layer comprises:
   a mask selectively exposing an underlying portion of at least one of the substrate, the shallow trench isolation, and the gate; and,
   a local interconnect covering the underlying portion of the at least one of the substrate, the shallow trench isolation, and the gate.

6. The device of claim 5, wherein the local interconnect comprises at least one selected from the group essentially consisting of titanium, titanium nitride and tungsten.

7. The device of claim 5, wherein the mask comprises tetra-ethyl-ortho-silicate.

8. The device of claim 1, further comprising an isolation trench partially filled with an oxide, wherein an edge of the oxide is below the heavily doped regions and intersects the second lightly doped regions.

9. A computerized system comprising at least one device, each device comprising:
   a gate over a substrate having two sidewalls, two first spacers immediately adjacent to and generally aligned with the sidewalls, and two second spacers overlapping and extending beyond the first spacers;
   first lightly doped regions within the substrate adjacent to and generally aligned with the sidewalls of the gate;
   heavily doped regions within the substrate below the first lightly doped regions and adjacent to and generally aligned with the first spacers; and,
   second lightly doped shortage protection regions within the substrate below the heavily doped regions and adjacent to and generally aligned with the second spacers.

10. The system of claim 9, wherein each device further comprises a shallow trench isolation within the substrate.

11. The system of claim 10, wherein each device further comprises an oxide layer within the shallow trench isolation.

12. The system of claim 10, wherein each device further comprises a metallization layer over the gate.

13. The system of claim 12, wherein the metallization layer comprises:
   a mask selectively exposing an underlying portion of at least one of the substrate, the shallow trench isolation, and the gate; and,
   a local interconnect covering the underlying portion of the at least one of the substrate, the shallow trench isolation, and the gate.

* * * * *

UNITED STATES PATENT AND TRADEMARK OFFICE
CERTIFICATE OF CORRECTION

PATENT NO. : 5,977,600  
DATED : November 2, 1999  
INVENTOR(S) : Wristers et al.

Page 1 of 1

It is certified that error appears in the above-identified patent and that said Letters Patent is hereby corrected as shown below:

Please change the inventor's name: "H. James Fulford" should read --H. Jim Fulford--

Column 3,  
Line 15: "tub" should read --tube--.

Signed and Sealed this

Tenth Day of July, 2001

*Attest:*

Nicholas P. Godici

NICHOLAS P. GODICI  
*Acting Director of the United States Patent and Trademark Office*

*Attesting Officer*